(12) United States Patent
Grimbergen (10) Patent No.: US 8,956,809 B2
(45) Date of Patent: Feb. 17, 2015

(54) APPARATUS AND METHODS FOR ETCHING QUARTZ SUBSTRATE IN PHOTOMASK MANUFACTURING APPLICATIONS

(71) Applicant: Michael Grimbergen, Redwood City, CA (US)

(72) Inventor: Michael Grimbergen, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 64 days.

(21) Appl. No.: 13/750,937

(22) Filed: Jan. 25, 2013

(65) Prior Publication Data

US 2014/0038091 A1 Feb. 6, 2014

Related U.S. Application Data

(60) Provisional application No. 61/679,649, filed on Aug. 3, 2012.

(51) Int. Cl.
*G03F 1/80* (2012.01)
(52) U.S. Cl.
CPC ........................................ *G03F 1/80* (2013.01)
USPC .................................. 430/323; 430/5; 216/67
(58) Field of Classification Search
CPC .............. G03F 1/80; C23F 1/00; C03C 25/68
USPC ........... 430/5, 311, 312, 322, 323; 216/67, 79
See application file for complete search history.

(56) References Cited

U.S. PATENT DOCUMENTS

| | | | |
|---|---|---|---|
| 2006/0154388 A1* | 7/2006 | Lewington et al. | 438/17 |
| 2007/0023393 A1* | 2/2007 | Nguyen et al. | 216/60 |
| 2008/0142476 A1* | 6/2008 | Koch et al. | 216/44 |
| 2008/0261335 A1 | 10/2008 | Grimbergen | |
| 2012/0103936 A1 | 5/2012 | Grimbergen | |

FOREIGN PATENT DOCUMENTS

| | | | |
|---|---|---|---|
| JP | 2001217227 A | 8/2001 |
| KP | 100195240 B1 | 6/1999 |
| KP | 0030275 A | 4/2008 |

OTHER PUBLICATIONS

PCT international search report and written opinion of PCT/US2013/050322 dated Oct. 22, 2013.

* cited by examiner

*Primary Examiner* — Stephen Rosasco
(74) *Attorney, Agent, or Firm* — Patterson & Sheridan, LLP (57) ABSTRACT

The present invention provides methods for etching a quartz substrate using a second level photoresist layer disposed thereon as an etching mask. In one embodiment, a method of etching a quartz substrate for forming a photomask includes providing a quartz substrate having a metal containing layer disposed thereon in an etch chamber, applying a first photoresist layer on a substrate, patterning the first photoresist layer to remove a first region of the metal containing layer to expose a first portion of the quartz substrate while remaining a second region of the metal containing layer on the quartz substrate, removing the remaining first photoresist layer on the quartz substrate, applying a second photoresist layer on the exposed quartz substrate and the second region of the metal containing layer, patterning the second photoresist layer to form openings in the second photoresist layer exposing the underlying quartz substrate, and etching the quartz substrate defined by the patterned second photoresist layer.

20 Claims, 5 Drawing Sheets

APPARATUS AND METHODS FOR ETCHING QUARTZ SUBSTRATE IN PHOTOMASK MANUFACTURING APPLICATIONS

CROSS-REFERENCE TO RELATED APPLICATION

This application claims benefit of U.S. Provisional Application Ser. No. 61/679,649 filed Aug. 3, 2012, which is incorporated by reference in its entirety.

BACKGROUND OF THE INVENTION

1. Field of the Invention

Embodiments of the present invention generally relate to the fabrication of integrated circuits and to the fabrication of photomasks useful in the manufacture of integrated circuits.

2. Description of the Related Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Thus, any defects in the mask may be transferred to the chip, potentially adversely affecting performance. Defects that are severe enough may render the mask completely useless. Typically, a set of 15 to 30 masks is used to construct a chip and can be used repeatedly.

A mask is typically a glass or a quartz substrate that has a layer of chromium on one side. The mask may also contain a layer of silicon nitride (SiN) doped with molybdenum (Mo), or alternating pairs of molybdenum (Mo) and silicon (Si) layers. The chromium layer is covered with an anti-reflective coating and a photosensitive resist. During a patterning process, the circuit design is written onto the mask by exposing portions of the resist to ultraviolet light, making the exposed portions soluble in a developing solution. The soluble portion of the resist is then removed, allowing the exposed underlying chromium to be etched. The etch process removes the chromium and anti-reflective layers from the mask at locations where the resist was removed, i.e., the exposed chromium is removed.

Figure 1A:
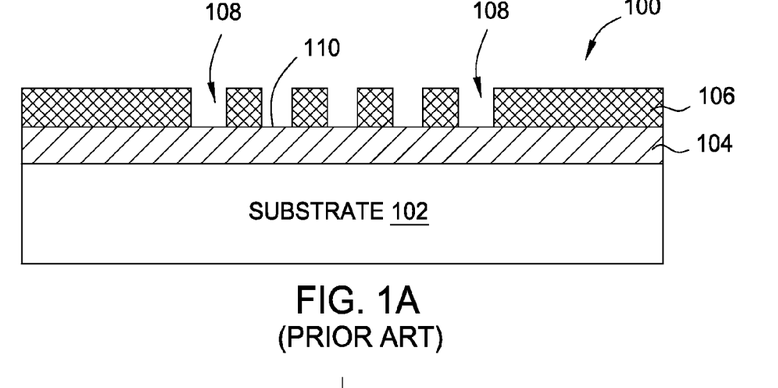
FIGS. 1A-1C illustrates a process of etching a metal containing layer disposed on a quartz substrate conventionally available in the art.
Figure 1B:
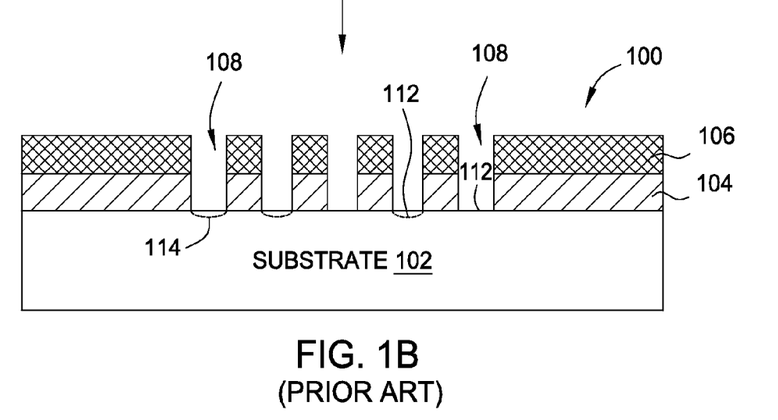
Figure 1C:
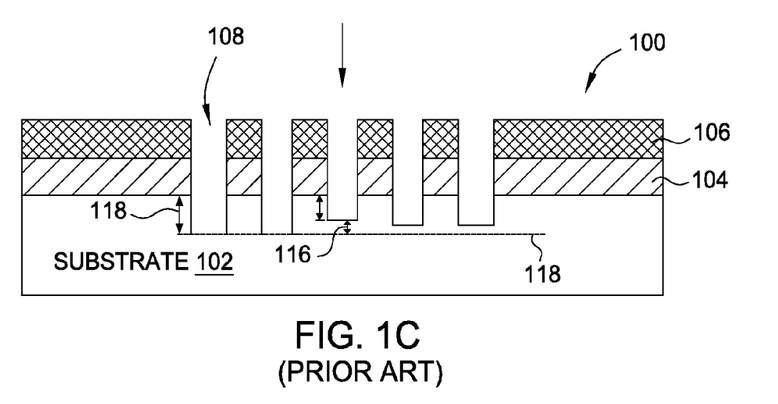

During the etching process, a plasma is used to enhance a chemical reaction and etch the exposed chromium and quartz area of the mask. Undesirably, conventional chromium and quartz etch processes often exhibit poor control of the etching endpoint, resulting in over-etching to the underlying quartz while patterning the chromium layer. Over-etching of the chromium layer results in damage to the underlying quartz, leading to an offset height of the quartz at different locations exposed by the patterned chromium layer. FIGS. 1A-1C depict an example of an etching process conventionally available and used to etch chromium and quartz. As shown in FIG. 1A, a quartz substrate 102 may include a chromium layer 104 having a patterning photoresist layer 106 disposed thereon. Openings 108 are formed in the photoresist layer 106 to expose a surface 110 of the chromium layer 104 for etching. Subsequently, an etching process is performed to etch the chromium layer 104 exposed by the openings 108 to expose the underlying quartz substrate 102. However, poor control of the etching process often result in over-etching deep to the underlying quartz substrate 102, undesirably removing a portion 114 of the quartz from the substrate 102, as shown in FIG. 1B. The over-etched portion 114 of the quartz substrate 102 results in an offset from the target etched surface 112, creating a different starting point of the quartz substrate 102 to the subsequent quartz substrate etching process. Accordingly, after performing the quartz etching process, the openings 108 formed in the quartz substrate 102 may have a different etching depth 118, 120 than the desired depth, thereby resulting in inaccurate feature transfer, as shown in FIG. 1C, and also correspondingly diminishing the ability to produce features having small critical dimensions using the mask.

As the critical dimensions of masks continue to shrink, the importance of uniform etch result increases. Thus, a quartz etch process having precise etching depth and dimension control is highly desirable.

Therefore, there is an ongoing need for an improved etching endpoint process control in photomask fabrication, including improved apparatus and methods for determining process endpoints.

SUMMARY OF THE INVENTION

The present invention provides a method and apparatus for etching a photomask substrate with enhanced process monitoring, for example, by providing for optical monitoring at certain regions of the photomask to obtain desired etch rate or thickness loss. In one embodiment, a method of etching a quartz substrate for forming a photomask includes placing a quartz substrate having a metal containing layer disposed thereon in an etch chamber, applying a first photoresist layer on a substrate, patterning the first photoresist layer to remove a first region of the metal containing layer to expose a first portion of the quartz substrate while a second region of the metal containing layer remains on the quartz substrate, removing the remaining first photoresist layer on the quartz substrate, applying a second photoresist layer on the exposed quartz substrate and the second region of the metal containing layer, patterning the second photoresist layer to form openings in the second photoresist layer exposing the underlying quartz substrate, and etching the quartz substrate through the openings defined by the patterned second photoresist layer.

In another embodiment, a method of etching a quartz substrate for forming a photomask includes placing a quartz substrate having a patterned metal containing layer disposed thereon in an etch chamber, the patterned metal containing layer forming openings therein exposing a portion of the quartz substrate, applying a photoresist layer on both the metal containing layer and the quartz substrate, patterning the photoresist layer to expose the quartz substrate, and etching the quartz substrate exposed by the patterned photoresist layer.

In yet another embodiment, a method of etching a quartz substrate for forming a photomask includes placing a quartz substrate having a patterned metal containing layer disposed thereon in an etch chamber, the patterned metal containing layer forming openings therein exposing a portion of the quartz substrate, applying a photoresist layer on both the metal containing layer and the quartz substrate, patterning the photoresist layer to expose the quartz substrate, etching the quartz substrate exposed by the patterned photoresist layer, directing a radiation from a backside of the substrate to the photoresist layer, wherein the radiation has a wavelength between about 170 nm and about 770 nm, and determining an etching endpoint according to the radiation reflected from the backside of the substrate.

BRIEF DESCRIPTION OF THE DRAWINGS

So that the manner in which the above recited features, advantages and objects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides a method and apparatus for etching a quartz substrate using a second level photoresist layer disposed on a quartz substrate as a mask along with an enhanced process monitoring to determine a process endpoint. Although the discussions and illustrative examples focus on the process control of forming a second level photoresist layer, the etching rate detection and process endpoint determination during an quartz substrate etching process, various embodiments of the invention can also be adapted for process monitoring of other suitable substrates, including transparent or dielectric substrates, or optical disks.

Figure 2:
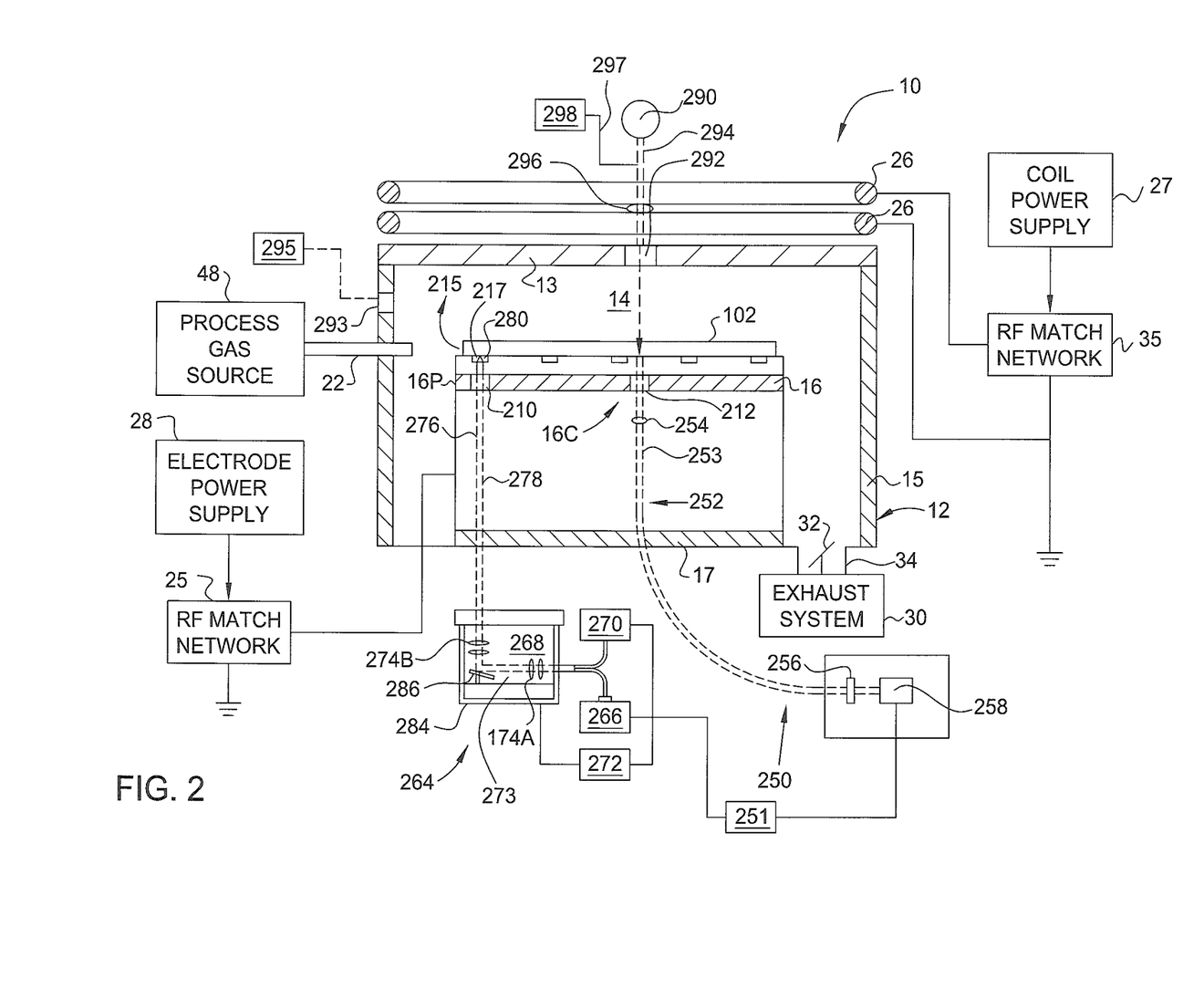
FIG. 2 illustrates a etch chamber incorporating one embodiment of the present invention.

FIG. 2 is a schematic cross sectional view of a plasma etch chamber 10 in accordance with one embodiment of the invention. Suitable plasma etch chambers include the Tetra™ II, Tetra™ III, Tetra™ X photomask etch chamber or the Decoupled Plasma Source (DPS™) chamber available from Applied Materials, Inc., of Santa Clara, Calif. Other process chambers may also be used in connection with embodiments of the invention, including, for example, capacitive coupled parallel plate chambers and magnetically enhanced ion etch chambers, as well as inductively coupled plasma etch chambers of different designs. The particular embodiment of the etch chamber 10 shown herein is provided for illustrative purposes and should not be used to limit the scope of the invention. It is contemplated that the invention may be utilized in other etch processing systems, including those from other manufacturers.

The plasma etch chamber 10 generally includes a cylindrical sidewall or chamber body 12, an energy transparent ceiling 13 mounted on the chamber body 12, and a chamber bottom 17. The ceiling 13 may be flat, rectangular, arcuate, conical, dome or multi-radius shaped. At least one inductive coil 26 is disposed above at least a portion of the ceiling 13. In the embodiment depicted in FIG. 1A, two concentric coils 26 are shown. The chamber body 12 and the chamber bottom 17 of the plasma etch chamber 10 can be made of a metal, such as anodized aluminum, and the ceiling 13 can be made of an energy transparent material such as a ceramic or other dielectric material.

A substrate support member 16 is disposed in the plasma etch chamber 10 to support a substrate 102 during processing. The support member 16 may be a conventional mechanical or electrostatic chuck with at least a portion of the support member 16 being electrically conductive and capable of serving as a process bias cathode. While not shown, a photomask adapter may be used to secure the photomask on the support member 16. The photomask adapter generally includes a lower portion milled to cover an upper portion of the support member and a top portion having an opening that is sized and shaped to hold a photomask. In one embodiment, the top portion of the photomask adapter has a square opening. A suitable photomask adapter is disclosed in U.S. Pat. No. 6,251,217, issued on Jun. 26, 2001, which is incorporated herein by reference to the extent not inconsistent with aspects and claims of the invention.

Process gases are introduced into the plasma etch chamber 10 from a process gas source 48 through a gas distributor 22 peripherally disposed about the support member 16. Mass flow controllers (not shown) for each process gas, or alternatively, for mixtures of the process gas, are disposed between the plasma etch chamber 10 and the process gas source 48 to regulate the respective flow rates of the process gases.

A plasma zone 14 is defined by the plasma etch chamber 10, the substrate support member 16 and the ceiling 13. A plasma is generated in the plasma zone 14 from the process gases by supplying power from a power supply 27 to the inductive coils 26 through an RF match network 35. The support member 16 may include an electrode disposed therein, which is powered by an electrode power supply 28 and generates a capacitive electric field in the plasma etch chamber 10 through an RF match network 25. Typically, RF power is applied to the electrode in the support member 16 while the body 12 is electrically grounded. The capacitive electric field, which is transverse to the plane of the support member 16, influences the directionality of charged species to provide more anisotropic etching of the substrate 102.

Process gases and etchant byproducts are exhausted from the plasma etch chamber 10 through an exhaust port 34 to an exhaust system 30. The exhaust system 30 may be disposed in the bottom 17 of the plasma etch chamber 10 or may be disposed in the body 12 of the plasma etch chamber 10 for removal of process gases. A throttle valve 32 is provided in the exhaust port 34 for controlling the pressure in the plasma etch chamber 10.

FIG. 2 further illustrates an endpoint detection system 264 operatively coupled to the plasma etch chamber 10 in accordance with one embodiment of the invention. According to embodiments of the invention, at least two optical access ports or viewports, are provided in different regions of the substrate support member 16. In the example shown in FIG. 2, the two optical access ports comprise respectively a window 210 at a peripheral region 16P, and a window 212 at a central region 16C. The endpoint detection system 264 is configured to detect optical signals through these windows, which allows optical monitoring of various locations on a photomask substrate 102 from its backside during etching. In one embodiment, a third window (not shown) may also be provided in the peripheral region 16P of the substrate support member 16. Alternatively, different numbers of windows may be provided at other locations of the substrate support member 16.

In general, a larger window facilitates the installation of optical components within the substrate support member 16. However, for apparatus in which the substrate support member 16 is RF biased, the size of the window, especially in the central region 16C of the substrate support member 16, is selected to be sufficiently large for optical monitoring, yet small enough to avoid potential adverse impact for the RF bias. Selecting a small window also improves the lateral temperature uniformity of the support member 16. The optical access port may generally comprise a flat window made of quartz or other materials that transmit light over a broad wavelength spectrum. A more detailed discussion of different optical configurations will be provided in a later section.

The endpoint detection system 264 comprises optical setup for operating in at least one of reflection, interferometry or transmission modes, and is configured for different types of measurements such as reflectance or transmittance, interferometry, or optical emission spectroscopy. Depending on the application of interest, e.g., the material layers or substrate structure being processed, endpoints may be detected based on a change in the reflectance or transmittance intensities, the number of interference fringes, or changes in optical emission intensities at specific wavelengths, or a combination thereof. In one particular embodiment depicted therein, the endpoint detection system 264 is configured to detect a process endpoint based on a change in the reflectance reflected from an etched substrate surface.

The reflection mode of operation allows reflectance (or reflectometry) and interferometric measurement to be performed. The endpoint detection system 264 generally comprises an optical light source 266, a focusing assembly 268 for focusing an incident optical beam 276 from the optical light source 266 onto a discreet area (spot) 180 on the surface of substrate 102, and a photodetector 270 for measuring the intensity of a reflected optical beam 278 reflected off the spot 280 of the substrate 102. A suitable adjustment mechanism 296 may be provided to set an angle of incidence 297 of the beam 276 so that the spot 280 may be selectively located on a desired location on the substrate 102. The adjustment mechanism 296 may be an actuator, set screw or other device suitable for setting the angle of incidence 297 by moving (tilting) the endpoint detection system 264 itself or a component thereof, such as with an optical beam positioned 284, further discussed below. The photodetector 270 may be a single wavelength or multi-wavelength detector, or a spectrometer. Based on the measured signal of the reflected optical beam 278, a computer system 272 calculates portions of the real-time waveform and compares it with a stored characteristic waveform pattern to extract information relating to the etch process. In one embodiment, the calculation may be based on slope changes or other characteristic changes in the detected signals, either in reflection or transmission mode, for example, when a film is etched to a target depth. Alternatively, the calculation may be based on interferometric signals as the depth of a trench or the thickness of a film changes during etching. In other embodiments, more detailed calculations may be performed based on interferometric signals obtained over a wide spectrum in order to determine the depth or thickness at any point in the etch process to determine etch rate of the object being etched.

The light source 266 may be monochromatic, polychromatic, white light, or other suitable light source. In general, the optical signal from the reflected optical beam 278 may be analyzed to extract information regarding the presence or absence of a layer (e.g., a metal containing layer, such as a chromium layer), or the thickness of certain material layers within the spot 280. The intensity of the incident optical beam 276 is selected to be sufficiently high to provide a reflected optical beam 278 with a measurable intensity. The lamp can also be switched on and off to subtract background light. In one embodiment, the light source 266 provides polychromatic light, e.g., from an Hg—Cd lamp, an arc lamp, or a light emitting diode (LED) or LED array, which generates light in wavelength ranges from about 140 nm to about 800 nm, or about 160 to 770 nm, for example about 170 nm to about 770 nm respectively. The polychromatic light source 266 can be filtered to provide an incident optical beam 276 having one or more selected frequencies. Color filters can be placed in front of the photodetector 270 to filter out all wavelengths except for one or more desired wavelengths of light, prior to measuring the intensity of the reflected optical beam 278 entering the photodetector 270. The light can be analyzed by a spectrometer (array detector with a wavelength-dispersive element) to provide data over a wide wavelength range, such as ultraviolet to visible, from about 170 nm to 800 nm, for example about 170 nm to about 770 nm. The light source 266 can also comprise a flash lamp, e.g., a Xe or other halogen lamp, or a monochromatic light source that provides optical emission at a selected wavelength, for example, a He—Ne or ND-YAG laser. The light source may be configured to operate in a continuous or pulsed mode. Alternatively, the wavelength range may be expanded into the deep UV as low as 150 nm or beyond using optical materials with stable deep UV transmission and purging air paths with inert gas or other suitable carrier gas. In this embodiment, an air purging gas source 251 may be disposed in the plasma etch chamber 10 to supply gas to the light source 266 in the endpoint detection system 264, or a spectrometer disposed in the photodetector 270 or any suitable path where the light may pass through. In one embodiment, the carrier gas supplied in the purging gas source 251 is $N_2$ gas.

One or more convex focusing lenses 274A, 274B may be used to focus the incident optical beam 276 to the spot 280 on the substrate surface, and to focus the reflected optical beam 278 back on the active surface of photodetector 270. The spot 280 should be sufficiently large to compensate for variations in surface topography of the substrate 102 and device design features. This enables detection of etch endpoints for high aspect ratio features having small openings, such as vias or deep narrow trenches, which may be densely present or more isolated. The area of the return optical beam 278 should be sufficiently large to activate a large portion of the active light-detecting surface of the photodetector 270. The incident and reflected optical beams 276, 278 are directed through the transparent window 292 in the etch chamber 10 that allows the optical beams to pass in and out of the processing environment.

The diameter of the beam spot 280 is generally about 2 mm to about 10 mm. However, if the beam spot 280 encompasses large isolated areas of the substrate 102 containing only a small number of etched features, it may be necessary to use a larger beam spot in order to encompass a greater number of etched features. The size of the beam spot can therefore be optimized, depending on the design features for a particular device. If the signal is sufficient, a large beam spot or field of view will enable process control without precisely matching the position of the substrate support hole and the etched area of the substrate giving rise to the signal.

Optionally, the optical beam positioner 284 may be used to move the incident optical beam 276 across the substrate 102 to locate a suitable portion of the substrate surface on which to position the beam spot 280 to monitor an etching process. The optical beam positioner 284 may include one or more primary mirrors 286 that rotate at small angles to deflect the optical beam from the light source 266 onto different positions of the substrate surface. Additional secondary mirrors may be used (not shown) to direct the reflected optical beam 278 on the photodetector 270. The optical beam positioner 284 may also be used to scan the optical beam in a faster pattern across the surface of the substrate 102. In this embodiment, the optical beam positioner 284 comprises a scanning assembly consisting of a movable stage (not shown), upon which the light source 266, the focusing assembly 268 and the photodetector 270 are mounted. The movable stage can be moved through set intervals by a drive mechanism, such as a stepper motor or galvanometer, to scan the beam spot 180 across the substrate 102.

The photodetector 270 comprises a light-sensitive electronic component, such as a photovoltaic cell, photodiode, phototransistor, or photomultiplier, which provides a signal in response to a measured intensity of the reflected optical beam 278. The signal can be in the form of a change in the level of a current passing through an electrical component or a change in a voltage applied across an electrical component. The photodetector 270 can also comprise a spectrometer (array detector with a wavelength-dispersive element) to provide data over a wide wavelength range, such as ultraviolet to visible, from about 150 nm to 800 nm. The reflected optical beam 278 undergoes constructive and/or destructive interference which increases or decreases the intensity of the optical beam, and the photodetector 270 provides an electrical output signal in relation to the measured intensity of the reflected optical beam 278. The electrical output signal is plotted as a function of time to provide a spectrum having numerous waveform patterns corresponding to the varying intensity of the reflected optical beam 278.

Additionally, other optical components, e.g., filters or fibers 273, including fibers with tapered ends or the use of fiber bundles may also be used to enhance monitoring. Suitable fibers may be used include a lamp spectrum-flattening filter, hollow fiber for VUV transmission down to 170 nm, reference fiber for during etching fiber solarization correction or the like. The use of multiple fibers (e.g., fiber bundle) allows optical signals to be monitored at different areas of the substrate. Depending on the specific features and detection techniques, signals from these different areas, such as different locations across the substrate, may be added together to provide an improved signal, or the different signals may be compared with each other and the best one selected for use in endpoint detection. In most embodiments, the collection optics is configured to sample optical signals in a direction substantially perpendicular to the plane of the substrate. In another embodiment, the collection optics may also sample signals from an oblique view angle, i.e., an angle not perpendicular to the substrate. This oblique viewing configuration will also result in an increased sampling area compared to the perpendicular configuration using the same collection optics.

In another embodiment, a plasma signal, e.g., plasma emission generated in the plasma zone, may also be collected for detection as needed for different process requirements. The plasma emission typically includes light at discrete wavelengths that are characteristic of various species present in the plasma. For example, emission can be monitored at one or more wavelengths that correspond to one or more etchant/reactant or etch product species. At the etch endpoint, e.g., when a certain material layer is completely etched and an underlying layer is exposed, the monitored emission intensity changes according to whether there is an increase or decrease of the emitting species being monitored. In general, the optical emission detection apparatus 250 of the endpoint detection system 264 comprises light collection assembly 252, a wavelength dispersive element 256 and a photodetector 258. In one embodiment, the light collection assembly 252 includes an optical fiber 253, and optionally, a lens 254 for coupling the optical signal to the fiber 253. The wavelength dispersive element 256 may be a spectrometer for separating the signal from the optical beams 278 into its component wavelengths. In other embodiments, the light collection assembly 252 may include various bulk optical components such as lenses and mirrors, and the wavelength dispersive element 256 may be a variety of filters to pass a selective range of wavelengths. Depending on the specific arrangements, the photodetector 258 may be configured to detect optical signals at a specific wavelength, or it may detect the signals at different wavelengths simultaneously. Suitable photodetectors may include a photodiode, photomultiplier tube or a charged-coupled device, among others.

In yet another embodiment, in the transmission mode of operation, the endpoint detection system 264 monitors the transmittance (e.g., total light intensity) or optical emission signals (e.g., wavelength-resolved emission) as a function of time. In one embodiment, the plasma in the etch chamber 10 serves as the light source for the optical emission monitoring. This configuration has the advantage of a simpler optical setup compared to the reflection mode, because it does not require an external light source and only one optical fiber is needed.

A computer program on a computer system 272 is used to analyze the shape of the measured waveform pattern of the reflected optical beam 278 and to determine the endpoint of the etching process. The waveform generally has a sinusoidal-like oscillating shape, with the trough of each wavelength occurring when the depth of the etched feature causes the return signal to be 180 degrees out of phase with the return signal reflected by the overlaying layer. The endpoint may be determined by calculating the etch rate using the measured waveform, phase information of the measured waveform and/or comparison of the measured waveform to a reference waveform. As such, the period of the interference signal may be used to calculate the depth and etch rate. The program may also operate on the measured waveform to detect a characteristic waveform, such as, an inflection point indicative of a phase difference between light reflected from different layers. The operations can be simple mathematic operations, such as evaluating a moving derivative to detect an inflection point.

Figure 3:
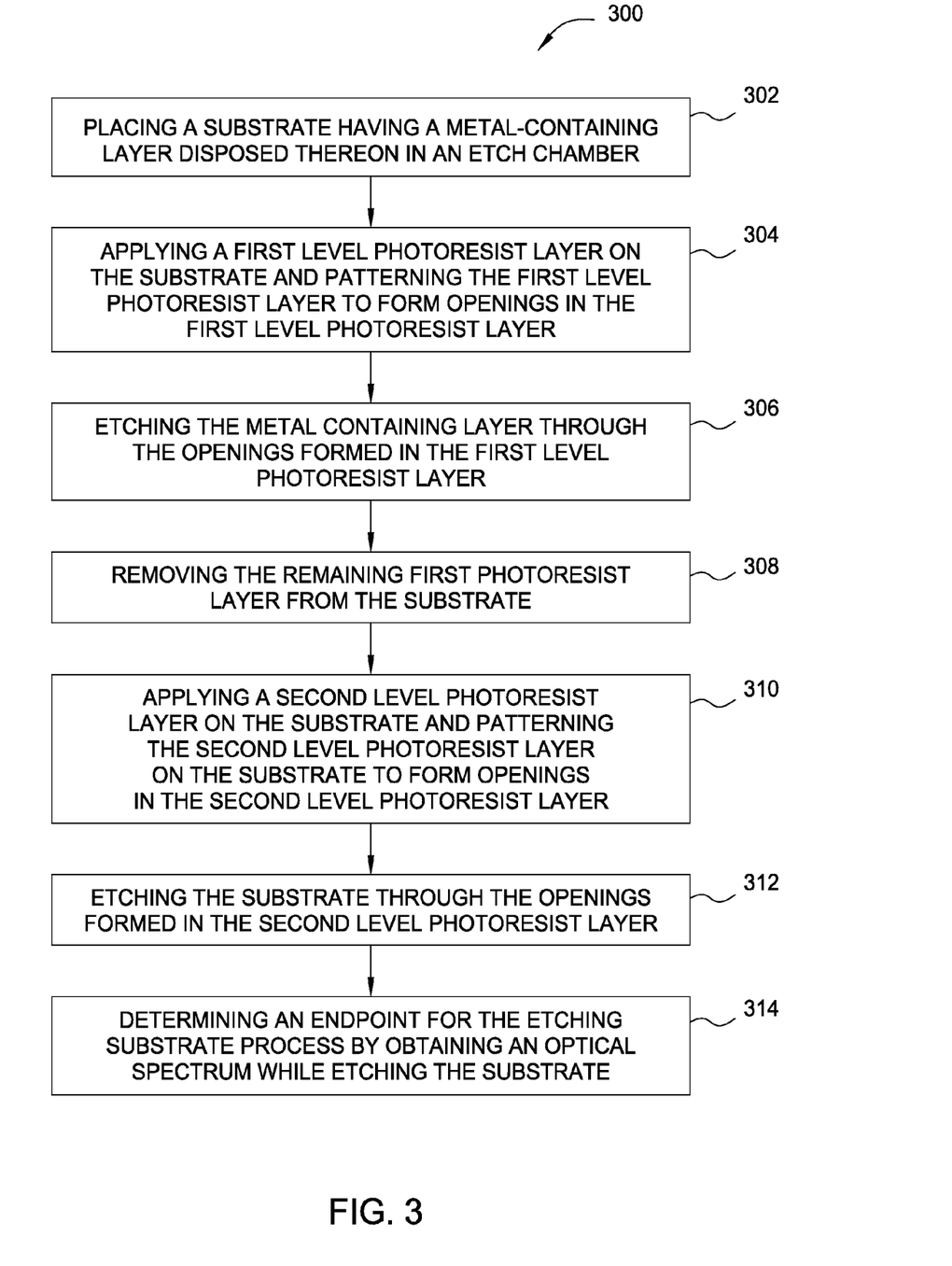
FIG. 3 illustrates a process flow diagram regarding an endpoint determination process during a fabrication process.

FIG. 3 is a flow diagram of one embodiment of a method 300 for etching a quartz layer and determining an etching process endpoint for etching the quartz layer. Although the method 300 is described below with reference to a substrate utilized to fabricate a photomask, the method 300 may also be used to advantage in other photomask etching or any etching applications.

Figures 4A, 4B:
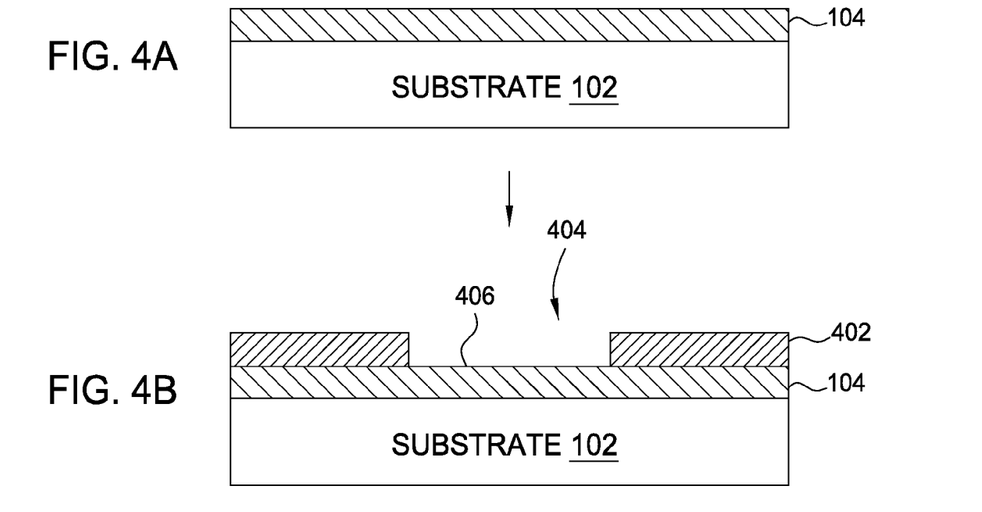
FIGS. 4A-4G illustrates schematically structures of one embodiment of the photomask during fabrication of the process depicted in FIG. 3.

The method 300 begins at block 302 when the photomask substrate 102 is transferred to and placed on a substrate support member disposed in an etch reactor, such as the etching chamber depicted in FIG. 1. The photomask substrate 102 includes an optically transparent silicon based material, such as quartz (i.e., silicon dioxide, $SiO_2$ layer) or low thermal expansion glass layer, as shown in FIG. 4A. An opaque light-shielding layer 104 of metal is disposed on the substrate 102.

Metals suitable for use as the opaque light-shielding layer 104 include chromium and/or chromium oxynitride. The substrate 102 may also include an absorber layer (not shown) of silicon nitride (SiN) doped with molybdenum (Mo) (e.g., MoSi) interposed between the quartz layer 102 and opaque light-shielding layer 104 as needed. As the exemplary embodiment depicted in FIG. 4A, the photomask substrate 102 may be a quartz substrate or a special low thermal expansion glass substrate. The photomask substrate 102 has a rectangular shape having sides between about 5 inches to about 9 inches in length. The photomask substrate 102 may be between about 0.15 inches and about 0.25 inches thick. In one embodiment, the photomask substrate 102 is about 0.25 inches thick.

At block 304, a first level of photoresist layer 402 is then formed over the opaque light-shielding layer 104 and being patterned to form openings 404 in the photoresist layer 402, exposing a surface 406 of the opaque light-shielding layer 104, as shown in FIG. 4B. The photoresist layer 402 may comprise any suitable photosensitive resist materials, such as an e-beam resist (for example, a chemically amplified resist (CAR)), and deposited and patterned in any suitable manner. The photoresist layer 402 may be deposited to a thickness between about 100 nm and about 1000 nm.

Figure 4C:
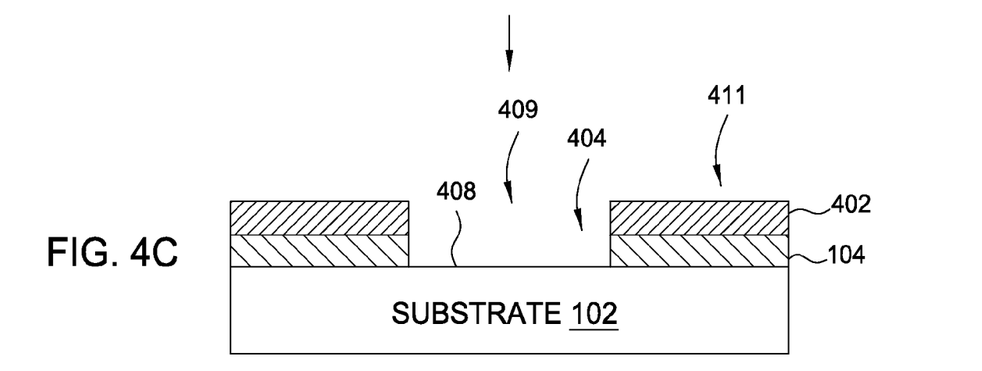

At block 306, an etching process is performed to etch the opaque light-shielding layer 104 through the openings 404 defined in the first level of the photoresist layer 402, as shown in FIG. 4C. The etching process is performed to remove a portion of the opaque light-shielding layer 104 until a surface 408 of a first region 409 of the underlying photomask substrate 102 is exposed. The opaque light-shielding layer 104 disposed on a second region 411 of the substrate 102 remains protected and un-removed on the substrate 102. Halogen-containing gases are often used for etching the opaque light-shielding layer 104 formed in the photomask structure. In one example, a process gas containing chlorine may be used for etching the opaque light-shielding layer 104 made from a chromium material. A plasma is generated from the process gas to perform the etching process until the underlying surface 408 of the target quartz substrate 102 is exposed.

Figure 4D:
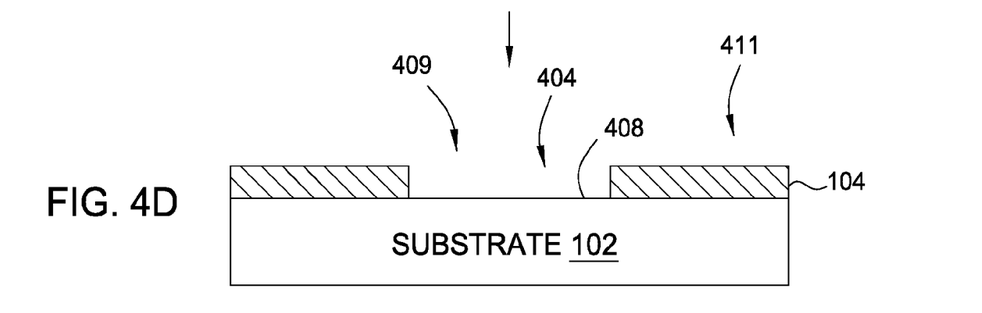

At block 308, after etching, a photoresist strip process is performed to remove the remaining photoresist layer 402 from the substrate 102, as shown in FIG. 4D. The photoresist layer 402 is removed from the substrate 102 to expose the patterned opaque light-shielding layer 104 and the substrate 102.

Figure 4E:
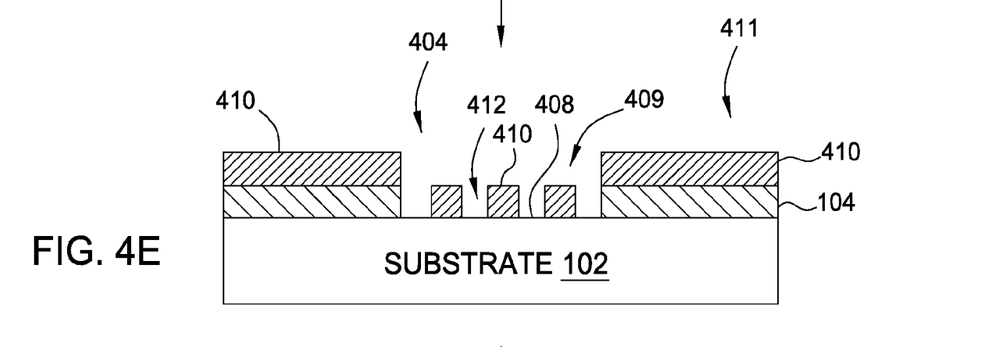

At block 310, a second level photoresist layer 410 is then applied and patterned on the substrate 102, as shown in FIG. 4E. As the surface 408 of the substrate 102 is exposed, the second level photoresist layer 410 is applied directly on the first region 409 of the substrate 102. In contrast, in the second region 411 where portion of the opaque light-shielding layer 104 still remains on the substrate, the second level photoresist layer 410 is then applied on the opaque light-shielding layer 104. By utilizing the second level photoresist layer 410, the second level photoresist layer can be directly disposed on the substrate 102, eliminating the use of the opaque light-shielding layer 104 as a mask layer during quartz substrate etching process. By doing so, a more precise etching process may be obtained. As the second level photoresist layer 410 is directly disposed in the second region 411 of the substrate 102, the openings 412 formed in the second level photoresist layer 410 can facilitate transferring features into the quartz substrate 102 without other different materials involved during the etching process. In the conventional practice, the opaque light-shielding layer 104 disposed between the substrate 102 and the photoresist layer 410 in the second region 411 may adversely interfere the etching performance during the subsequent etching process. Interference created when etching different materials may result in non-uniform etching rate within the openings 412, resulting in an undesired offset height at the surface of the quartz substrate, as discussed above with referenced to FIG. 1A-1C. Thus, the second level photoresist layer 410 directly disposed in the second region 411 of the substrate 102 may simplify the etching complexity and assist precise etching control of the quartz substrate 102 through the openings 412 formed in the second level photoresist layer 410.

In one embodiment, the second level photoresist layer 410 may be the same material as the first level photoresist layer 402. The second level photoresist layer 410 is a light sensitive material fabricated by an organic material. In one embodiment, the second photoresist layer 410 may be in liquid form to be spray-coated onto the substrate surface. In one embodiment, the second level photoresist layer 410 may have a reflective index (n) between about 2.1 and about 1.55 and an extinctive coefficient (k) between about 0.2 and about 0.9. In one embodiment, the second level photoresist layer 410 has an extinctive coefficient greater than 0.3. The second level photoresist layer 410 having the n and k value at this particular range may efficiently absorb light at wavelengths between 160 nm and about 250 nm, thus rendering the second level photoresist layer suitable for use at DUV, VDUV wavelengths. The monitor optical wavelength is selected so that the resulting n and k of the second level photoresist layer minimize optical interference with photoresist layer from the light source directed thereto during the etching process. Accordingly, during etching, when a light source from an end point detector is directed to different locations of the substrate with different materials, such as the second level photoresist layer and a quartz material, different reflection signal may be obtained. By analyzing different signals as obtained, a proper etching endpoint may be obtained.

In one embodiment, the second level photoresist layer 410 may have a thickness between about 1500 Å and about 5000 Å, such as between about 2000 Å and about 4500 Å. The thickness of the second level photoresist layer 410 is selected so when a light source from an end point detector is directed to the second level photoresist layer 410, the reflective signal may substantially remains steady. Thus, the signal reflected from the second level photoresist layer 410 will not affect the signal reflected from the quartz substrate, thereby assisting in determining a precise endpoint without other signal noise.

Figure 4F:
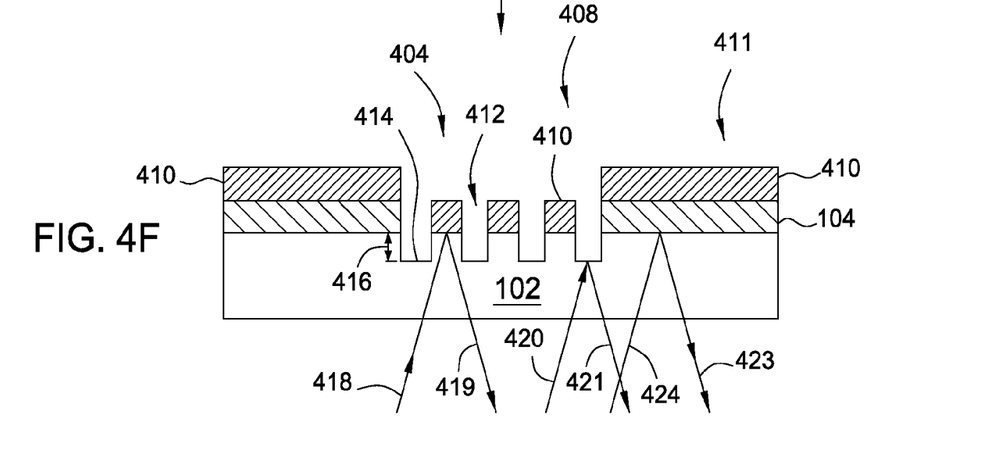

At block 312, an etching process is performed to etch the quartz substrate 102 through the openings 412 defined in the second level photoresist layer 410, as shown in FIG. 4F. In one embodiment, a processing gas mixture including halogen-containing gases is used for etching the substrate 102. In one example, a fluorine-containing gas such as trifluoromethane ($CHF_3$), tetrafluoromethane ($CF_4$), $C_2F$, $C_4F_6$, $C_3F_8$ and $C_5F_8$, may be used for etching quartz. The processing gas mixture may further include an inert gas, such as He, Ar, Xe, Ne, and Kr.

In one embodiment, the halogen containing gas supplied in the processing gas mixture includes $CF_4$ supplying at a rate of 2 to 50 standard cubic centimeters per minute (sccm) and $CFH_3$ at a rate of 2 sccm to 50 sccm. One specific process recipe provides $CF_4$ at a rate of 9 sccm, $CHF_3$ at a rate of 26 sccm. The pressure in the etch chamber is controlled to less than about 40 mTorr, and in one embodiment, between about 1 and about 10 mTorr, for example 2 mTorr.

RF source power is applied between about 300 W to about 600 W to form a plasma from the process gas mixture. In one example, RF source power of about 420 W is applied at a frequency of about 13.56 MHz. A pulsed substrate bias power less than about 600 W, such as less than about 100 W, for example between 20 W and about 150 W, is applied to the substrate support to bias the substrate 102. One specific process recipe applies about 65 W of bias power. The bias power is applied less than about 600 Watts at a frequency between about 1 to about 10 kHz, with a duty cycle between about 10 to about 95 percent. In another embodiment, the bias power is applied between about 20 to about 150 Watts, at a frequency between about 2 to about 5 kHz, with a duty cycle between about 20 to about 95 percent. In yet another embodiment, a pulsed RF bias power may be supplied between about 20 W to about 150 W, at a frequency between about 2 to about 5 kHz, with a duty cycle between about 70 to about 90 percent. In yet another embodiment, a pulsed RF bias power may be supplied between about 20 W to about 150 W, at a frequency between about 2 to about 5 kHz, with a duty cycle between about 20 to about 40 percent.

During etching, an incident optical beam 418, 420, 424 from the endpoint detection system 264 is directed to the etched substrate surface. The incident optical beam 418, 420, 424, as shown in FIG. 4F, from the endpoint detection system 264 is directed, through one of the windows, onto one or more areas of the photomask substrate 102. The incident optical beam 418, 420, 424 may have a wavelength between about 170 nm to about 770 nm. The incident optical beam 418, 420, 424 is configured to be directed to the opening 412, such as open areas where the substrate 102 is exposed by the patterned second level photoresist layer, or vias, and/or apertures in the substrate 102 as needed. Alternatively, the plasma itself may be used as the light source.

A return beam 419, 421, 423, e.g., reflecting off the surface from the backside of etched substrate surface 414 or the area covered by the patterned second level photoresist layer 410, is detected by the photodetector 270 of the endpoint detection system 264. Alternatively, the return beam may be plasma light reflected off and/or transmitted through the photomask or substrate surface at the directed areas. During etching, the intensity of the reflected optical beam 421 changes overtime. The time-varying intensity of the reflected optical beam 421 at a particular wavelength is then analyzed to determine at least one of the depth etched, the etch rate and the end point of the absorber layer etching process.

At block 314, an etching process endpoint is determined by analyzing the spectrum obtained from the detected reflected optical beam 419, 421, 423 reflected from the surface of the etched substrate. Collecting a spectrum of wavelengths will provide numerous waveform patterns. The reflected optical beam 419, 421, 423 are detected real-time when a production substrate is etched into the etch chamber. Generally, the end point of the etching process may be obtained by calculating the number of fringes present in the reflected optical beam 419, 421, 423. The number of fringes (f) is counted to estimate the thickness loss during the etching process, so as to determine a proper endpoint when a desired etching depth is obtained. The etch rate may be calculated using one or more wavelengths from the reflected optical beam 419, 421, 423 in the spectrum. Since the fringes (f) are accurate indicators of a known depth, using the etch rate to etch the final portion of the layer minimizes potential error. Combining etch rates determined at different wavelengths can yield improved accuracy. In one embodiment, when a number of about 2 fringes is detected, a thickness loss of about 150 nm of quartz substrate may be obtained.

Alternatively, the endpoint may be obtained by time mode based on the etch rate detected. After a predetermined processing time is reached, the desired depth of the quartz substrate may be then removed therefrom.

Figure 4G:
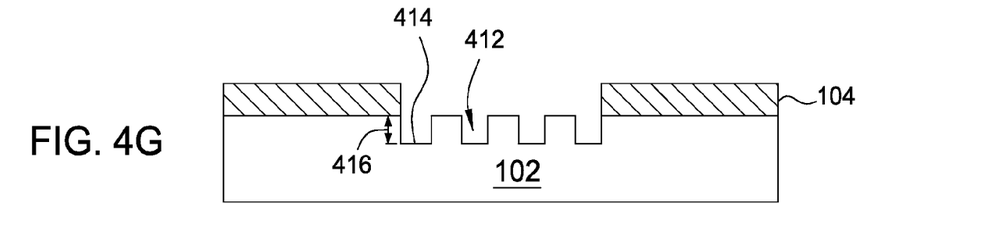

At block 314, after an endpoint of the etching process is reached and determined, the etching process may be terminated. A trench with desired depth 416 is then obtained, as show in FIG. 4G. By utilizing the second level photoresist layer, a uniform etching depth is obtained as the undesired offset issue from the conventional practice is eliminated.

While the foregoing is directed to embodiments of the present invention, other and further embodiments of the invention may be devised without departing from the basic scope thereof, and the scope thereof is determined by the claims that follow.

The invention claimed is:

1. A method of etching a quartz substrate for forming a photomask, comprising:
    placing a quartz substrate having a metal containing layer disposed thereon in an etch chamber;
    applying a first photoresist layer on a substrate;
    patterning the first photoresist layer to remove a first region of the metal containing layer to expose a first portion of the quartz substrate while a second region of the metal containing layer remains on the quartz substrate;
    removing the remaining first photoresist layer on the quartz substrate;
    applying a second photoresist layer on the exposed quartz substrate and the second region of the metal containing layer;
    patterning the second photoresist layer to form openings in the second photoresist layer exposing the underlying quartz substrate;
    etching the quartz substrate through the openings defined by the patterned second photoresist layer; and
    determining an etching endpoint by using a radiation directed to the second photoresist layer disposed on the substrate during the etching process.

2. The method of claim 1, wherein the quartz substrate is a photomask reticle.

3. The method of claim 1, wherein the wavelength directed to the second photoresist layer disposed on the substrate having a wavelength between about 170 nm to about 770 nm.

4. The method of claim 3, further comprising:
    analyzing waveform obtained from a radiation reflected from the substrate.

5. The method of claim 4, further comprising:
    calculating fringes from the waveform to determine the etching endpoint.

6. The method of claim 3, wherein the radiation is directed to a backside of the substrate to determine the etching endpoint.

7. The method of claim 1, wherein the radiation is directed from a backside of the substrate to the second photoresist layer disposed on the quartz substrate.

8. The method of claim 1, wherein the second photoresist has an extinctive coefficient greater than about 0.3.

9. The method of claim 1, wherein a metal containing layer is a chromium containing layer.

10. The method of claim 1, wherein the first photoresist layer is the same material as the second photoresist layer.

11. A method of etching a quartz substrate for forming a photomask, comprising:
    placing a quartz substrate having a patterned metal containing layer disposed thereon in an etch chamber, the patterned metal containing layer forming opening therein exposing a portion of the quartz substrate;
    applying a photoresist layer on both the metal containing layer and the quartz substrate;

patterning the photoresist layer to expose the quartz substrate;

etching the quartz substrate exposed through the patterned photoresist layer; and directing a radiation from a backside of the substrate to the photoresist layer disposed on the substrate during the etching process.

12. The method of claim 11, wherein etching the quartz substrate further comprises:

determining an endpoint for the etching process according to the reflected radiation detected from the backside of the substrate.

13. The method of claim 12, wherein the radiation has a wavelength between about 170 nm to about 770 nm.

14. The method of claim 12, wherein determining the endpoint further comprises:

analyzing waveform obtained from the reflected radiation; and calculating fringes from the waveform to determine the etching endpoint.

15. The method of claim 14, wherein a number of about 2 fringes as detected corresponds to a thickness low of about 150 nm.

16. The method of claim 11, wherein the photoresist has an extinctive coefficient greater than 0.3.

17. The method of claim 11, wherein a metal containing layer is a chromium containing layer.

18. The method of claim 11, wherein the quartz substrate is a photomask reticle.

19. A method of etching a quartz substrate for forming a photomask, comprising:

placing a quartz substrate having a patterned metal containing layer disposed thereon in an etch chamber, the patterned metal containing layer forming opening therein exposing a portion of the quartz substrate;

applying a photoresist layer on both the metal containing layer and the quartz substrate;

patterning the photoresist layer to expose the quartz substrate;

etching the quartz substrate exposed through the patterned photoresist layer;

directing a radiation from a backside of the substrate to the photoresist layer disposed directly on the substrate, wherein the radiation has a wavelength between about 170 nm and about 770 nm; and determining an etching endpoint according to the radiation reflected from the backside of the substrate.

20. The method of claim 19, wherein the photoresist layer has a refractive index selected to minimize interference with the radiation directed thereto.

* * * * *